(12) United States Patent
Sutardja

(10) Patent No.: US 9,009,393 B1
(45) Date of Patent: Apr. 14, 2015

(54) HYBRID SOLID-STATE DISK (SSD)/HARD DISK DRIVE (HDD) ARCHITECTURES

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 347 days.

(21) Appl. No.: 13/550,345

(22) Filed: Jul. 16, 2012

Related U.S. Application Data

(60) Provisional application No. 61/511,301, filed on Jul. 25, 2011, provisional application No. 61/524,234, filed on Aug. 16, 2011.

(51) Int. Cl.
  *G06F 12/00* (2006.01)
  *G06F 12/02* (2006.01)

(52) U.S. Cl.
  CPC .................................. *G06F 12/0246* (2013.01)

(58) Field of Classification Search
  None
  See application file for complete search history.

(56) References Cited

U.S. PATENT DOCUMENTS

| | | |
|---|---|---|
| 5,854,507 A | 12/1998 | Miremadi et al. |
| 6,049,129 A | 4/2000 | Yew et al. |
| 6,445,594 B1 | 9/2002 | Nakagawa et al. |
| 6,642,610 B2 | 11/2003 | Park et al. |
| 6,917,107 B2 | 7/2005 | Akram |
| 7,368,319 B2 | 5/2008 | Ha et al. |
| 7,432,599 B2 | 10/2008 | Verma et al. |
| 7,518,226 B2 | 4/2009 | Cablao et al. |
| 7,851,899 B2 | 12/2010 | Chen et al. |
| 8,253,231 B2 | 8/2012 | Sutardja |
| 8,359,425 B2 * | 1/2013 | Iwasaki et al. ................ 711/103 |
| 8,860,201 B1 | 10/2014 | Sutardja |
| 2007/0246840 A1 | 10/2007 | Chye et al. |
| 2008/0006948 A1 | 1/2008 | Wu et al. |
| 2009/0108425 A1 | 4/2009 | Lee et al. |
| 2012/0011303 A1 * | 1/2012 | Iwasaki et al. ................ 711/103 |

OTHER PUBLICATIONS

Package-on-Package Variations on the Horizon; Flynn Carson, STATS ChipPAC Inc., Fremont, CA—Semiconductor International, May 1, 2008; 6 Pages.

* cited by examiner

*Primary Examiner* — Brian Peugh

(57) ABSTRACT

A system including a packaging substrate and first and second integrated circuits arranged on the packaging substrate. The first integrated circuit includes a dynamic random access memory. The second integrated circuit includes a system-on-chip, which includes a hard disk controller to control a hard disk drive, a solid-state disk controller to control flash memory arranged external to the packaging substrate, and a dynamic random access memory controller to communicate with the dynamic random access memory. The hard disk controller and the solid-state disk controller access the dynamic random access memory via the dynamic random access memory controller. The dynamic random access memory controller is connected to the dynamic random access memory via the packaging substrate.

14 Claims, 7 Drawing Sheets

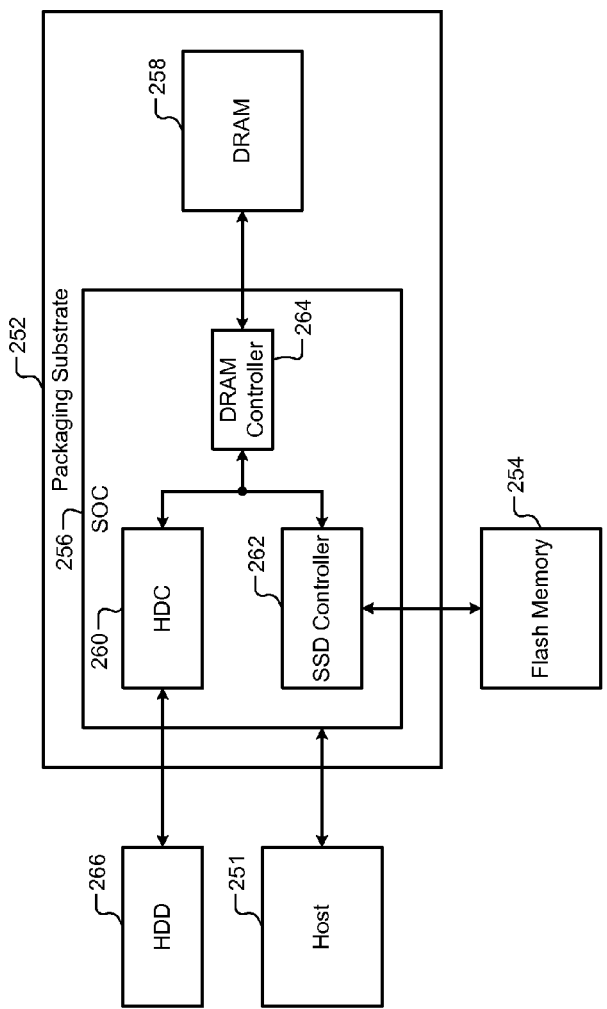
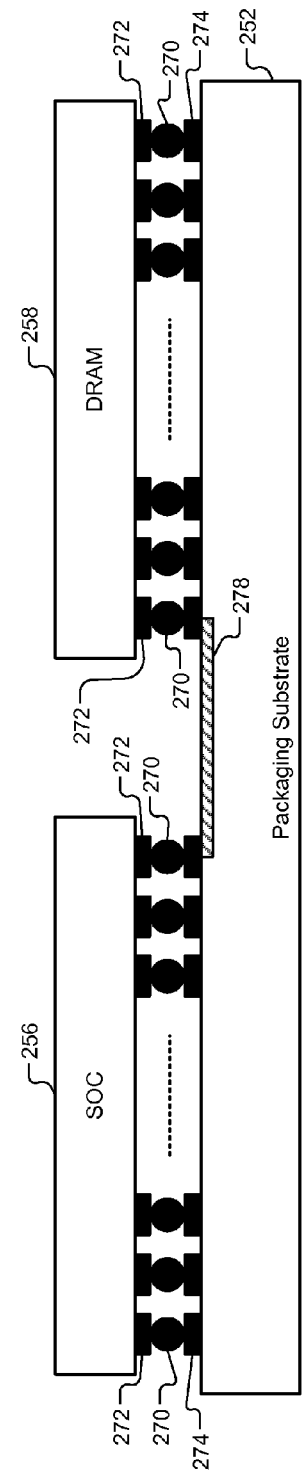

HYBRID SOLID-STATE DISK (SSD)/HARD DISK DRIVE (HDD) ARCHITECTURES

CROSS-REFERENCE TO RELATED APPLICATIONS

This application claims the benefit of U.S. Provisional Application No. 61/511,301, filed on Jul. 25, 2011, and U.S. Provisional Application No. 61/524,234, filed Aug. 16, 2011.

This application is related to U.S. application Ser. No. 12/565,430, filed on Sep. 23, 2009, which claims the benefit of U.S. Provisional Application Nos. 61/099,355, filed on Sep. 23, 2008 and 61/121,018, filed on Dec. 9, 2008.

The disclosures of the above applications are incorporated herein by reference in their entirety.

FIELD

The present disclosure relates generally to storage systems and more particularly to hybrid solid-state disk (SSD)/hard disk drive (HDD) architectures for storage systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Hard disk drives (HDDs) and solid-state disk drives (SSDs) are used in computing devices such as laptop computers and personal digital assistants (PDAs) to store data. The HDDs generally provide primary storage and are typically installed internally in these devices. The SSDs generally provide secondary storage and can be installed internally or externally in these devices.

SUMMARY

A system including a solid-state disk controller and a hard disk controller system-on-chip. The solid-state disk controller is configured to (i) control flash memory and (ii) communicate with a host. The solid-state disk controller includes (i) a first interface to interface a hard disk drive to the host and (ii) a second interface to interface with a dynamic random access memory arranged external to the solid-state disk controller. The hard disk controller system-on-chip is configured to (i) control the hard disk drive, (ii) communicate with the host via the first interface of the solid-state disk controller, and (iii) access the dynamic random access memory via the second interface of the solid-state disk controller.

In other features, the solid-state disk controller is configured to transfer data between the host and at least one of the flash memory, the dynamic random access memory, and the hard disk drive.

In other features, the system further includes at least one of the flash memory, the dynamic random access memory, and the hard disk drive.

In still other features, a system including a hard disk controller system-on-chip and a solid-state disk controller. The hard disk controller system-on-chip is configured to (i) control a hard disk drive and (ii) communicate with a host. The hard disk controller includes (i) a first interface to interface with the hard disk drive and (ii) a second interface to interface with a dynamic random access memory arranged external to the hard disk controller system-on-chip. The solid-state disk controller is configured to (i) control flash memory, (ii) communicate with the host via the hard disk controller system-on-chip, and (iii) access the dynamic random access memory via the second interface of the hard disk controller.

In other features, the hard disk controller system-on-chip is configured to transfer data between the host and at least one of the hard disk drive, the dynamic random access memory, and the solid-state disk controller.

In other features, the system further includes at least one of the flash memory, the dynamic random access memory, and the hard disk drive.

In still other features, a system including a packaging substrate and a first integrated circuit and a second integrated circuit arranged on the packaging substrate. The first integrated circuit includes a dynamic random access memory. The second integrated circuit includes a system-on-chip. The system-on-chip includes a hard disk controller configured to control a hard disk drive, a solid-state disk controller configured to control flash memory arranged external to the packaging substrate, and a dynamic random access memory controller configured to communicate with the dynamic random access memory. The hard disk controller and the solid-state disk controller access the dynamic random access memory via the dynamic random access memory controller. The dynamic random access memory controller of the second integrated circuit is connected to the dynamic random access memory of the first integrated circuit via the packaging substrate.

In other features, the system further includes a third integrated circuit including the flash memory. The packaging substrate and the third integrated circuit are mounted on a printed circuit board.

In other features, the system further includes a first serial interface and a second serial interface. The first serial interface is configured to communicate with the solid-state disk controller. The first serial interface is included in the second integrated circuit. The second serial interface is configured to communicate with the third integrated circuit including the flash memory. The second serial interface is arranged on the printed circuit board.

In still other features, a system includes a first integrated circuit arranged on a packaging substrate. The first integrated circuit includes a system-on-chip. The system-on-chip includes a hard disk controller configured to control a hard disk drive, a solid-state disk controller configured to control flash memory arranged external to the packaging substrate, a dynamic random access memory controller configured to communicate with a dynamic random access memory arranged external to the packaging substrate, and a first serial interface. The hard disk controller and the solid-state disk controller access the dynamic random access memory via the dynamic random access memory controller. The solid-state disk controller is configured to control the flash memory via the first serial interface.

In other features, the system further includes a second integrated circuit including the flash memory and a second serial interface configured to communicate with the second integrated circuit and the first serial interface. The packaging substrate, the second integrated circuit, and the second serial interface are mounted on a printed circuit board.

In other features, the system further includes the dynamic random access memory arranged on the printed circuit board.

In still other features, a system including an integrated circuit and a system-on-chip. The integrated circuit includes a dynamic random access memory, a dynamic random access memory controller configured to control the dynamic random access memory, and a first serial interface. The system-on-chip includes a hard disk controller configured to control a hard disk drive, a solid-state disk controller configured to control flash memory arranged external to the system-on-chip, and a second serial interface. The hard disk controller and the solid-state disk controller access the dynamic random access memory via the second serial interface.

In other features, the system-on-chip is packaged as a quad flat package or a quad flat no-leads package.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 4A is a functional block diagram of a hybrid system, where a SOC includes a HDC and a SSD controller, the SOC and DRAM are arranged on a silicon substrate, and the HDC and the SSD controller share the DRAM;

FIG. 4B depicts connections between the SOC and the DRAM of FIG. 4A;

DESCRIPTION

A hard disk drive (HDD) and a solid-state disk (SSD) may be combined into a hybrid system to store data. In the hybrid system, unimportant or infrequently accessed data may be moved from the SSD to the HDD. Additionally, data that needs to be duplicated may be copied from the SSD to the HDD. Functionalities of the HDD and the SSD can be combined in different ways as described below.

Figure 1:
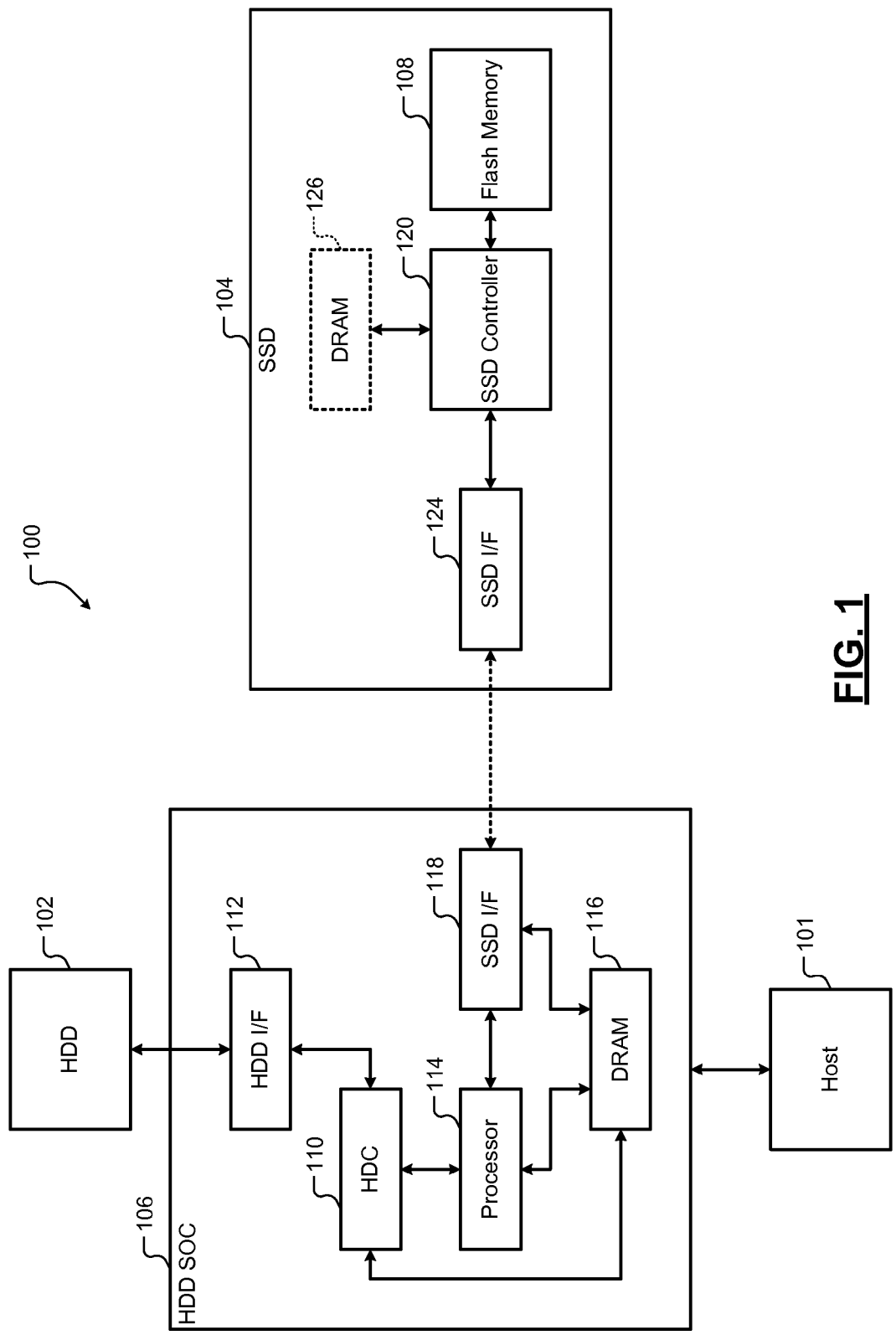
FIG. 1 is a functional block diagram of a hybrid system, where a hard disk drive system-on-chip (HDD SOC) and/or a solid-state disk (SSD) controller includes dynamic random access memory (DRAM)

Referring now to FIG. 1, a hybrid system 100 including a HDD 102 and a SSD 104 is shown. A HDD system-on-chip (SOC) 106 controls the HDD 102. The HDD SOC 106 communicates with a host 101. The SSD 104 communicates with the host 101 via the HDD SOC 106.

The HDD SOC 106 includes a hard disk controller (HDC) 110, a HDD interface 112, a processor 114, random access memory (RAM) such as dynamic RAM (DRAM) 116, and a SSD interface 118. The SSD 104 includes flash memory 108, a SSD controller 120, a SSD interface 124, and DRAM 126 (optional).

The HDD SOC 106 communicates with the host 101 and controls the HDD 102 via the HDD interface 112. The HDD interface 112 may include a serial advanced technology attachment (SATA) interface or other suitable interface used by the HDD 102. The HDD SOC 106 communicates with the SSD 104 via the SSD interface 118. The HDD SOC 106 translates flash commands into HDD commands and vice versa. The DRAM 116 is used to buffer portions of data transferred between the HDD 102, the SSD 104, and the host 101.

The SSD controller 120 controls the flash memory 108. The SSD interface 124 allows the SSD 104 to communicate with the HDD SOC 106. The SSD interface 124 may utilize the DRAM 116 in the HDD SOC 106. Alternatively, the SSD 104 may include the DRAM 126. The DRAM 126 is shown using dotted lines to indicate that the DRAM 126 is optional.

The SSD interfaces 118 and 124 include a low-pin-count interface that allows the SSD 104 to be easily connected to the HDD SOC 106 to form the hybrid system 100 and to be easily disconnected from the HDD SOC 106 when the hybrid system 100 is not needed. For example only, the SSD interfaces 118 and 124 may include an interface used by an embedded multi-media card (eMMC). Other interfaces are contemplated.

In the hybrid system 100, including the DRAM 126 in the SSD 104 can improve the performance of the SSD 104. Including the DRAM 126 in the SSD 104, however, increases the cost of manufacturing the SSD 104. Additionally, including the DRAM 116 in the HDD SOC 106 increases the pin count and cost of the HDD SOC 106.

Performance of the SSD 104 can be increased and the cost and pin count of the HDD SOC 106 can be decreased as follows. The SSD 104 can be used to interface the HDD SOC 106 to the host instead of using the HDD SOC 106 to interface the SSD 104 to the host. The SSD 104 can provide a tunneling interface to the HDD 102 for data that need not be stored in the SSD 104 or for data that needs to be duplicated on the HDD 102. Accordingly, the DRAM that is normally included in the HDD SOC 106 can be included in the SSD 104 instead. The DRAM included in the SSD 104 can improve the performance of the SSD 104 while providing the tunneling interface for the HDD 102 to share the DRAM included in the SSD 104. Since the HDD SOC 106 does not include the DRAM, the pin count and cost of the HDD SOC 106 can be reduced.

Figure 2:
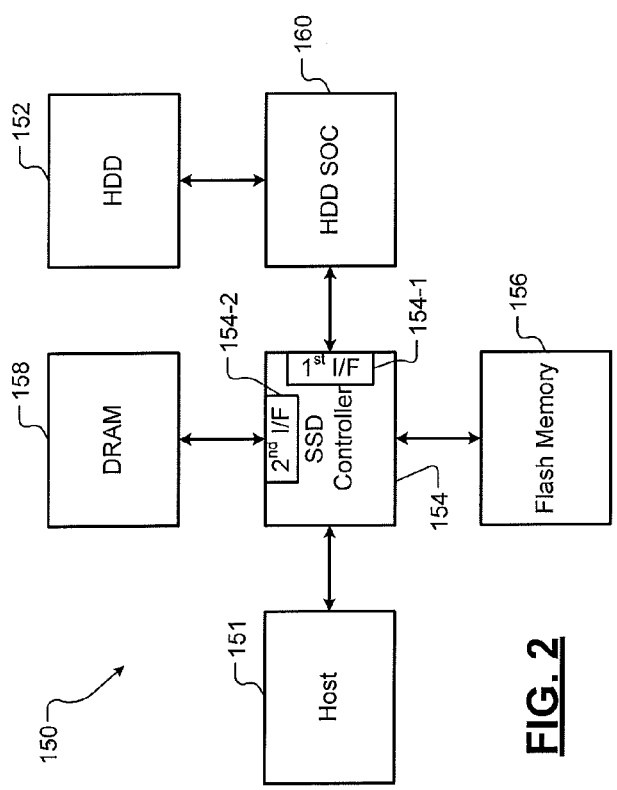
FIG. 2 is a functional block diagram of a hybrid system, where a HDD SOC does not include DRAM, and the HDD SOC accesses DRAM arranged external to a SSD controller via the SSD controller.

Referring now to FIG. 2, a hybrid system 150 includes a HDD 152, a SSD controller 154, flash memory 156, DRAM 158, and a HDD SOC 160. The SSD controller 154 controls the flash memory 156. The SSD controller 154 includes a suitable HDD interface 154-1 (e.g., SATA interface) that is used to interface the HDD 152 via the HDD SOC 160 to a host 151. The SSD controller 154 includes an interface 154-2 to interface with the DRAM 158 arranged external to the SSD controller 154. The HDD SOC 160 controls the HDD 152 and communicates with the host 151 via the SSD controller 154.

The SSD controller 154 translates flash commands into HDD commands and vice versa. The SSD controller 154 communicates with the host 151 and transfers data between the host 151 and at least one of the flash memory 156, the DRAM 158, and the HDD 152.

The HDD SOC 160 and the SSD controller 154 do not include DRAM. The HDD SOC 160 borrows the DRAM 158 via the SSD controller 154 as needed. The HDD SOC 160 coordinates the use of the DRAM 158 with the SSD controller 154.

For example, the HDD SOC 160 can send a request to the SSD controller 154 when the HDD SOC 160 needs to access the DRAM 158. The request may indicate a type of data transfer, a length and/or duration of the data transfer, and so on, that the HDD SOC 160 needs to perform with the DRAM 158. The SSD controller 154 determines if the HDD SOC 160 can be granted access to the DRAM 158. For example, the SSD controller 154 can grant the HDD SOC 160 access to the DRAM 158 if the SSD controller 154 is not currently accessing the DRAM 158, or if the SSD controller 154 can temporarily suspend its access to the DRAM 158, and so on.

Alternatively, the SSD controller 154 can grant the HDD SOC 160 access to the DRAM 158 if the SSD controller 154 will not access the DRAM 158 for a predetermined period of time. The predetermined period of time can be greater than an amount of time for which the HDD SOC 160 requests access to the DRAM 158. For example, the amount of time may depend on the type of data transfer the HDD SOC 160 needs to perform with the DRAM 158. If granted access, the HDD SOC 160 can indicate to the SSD controller 154 when the data transfer is completed so that the SSD controller 154 can resume using the DRAM 158.

Figure 3:
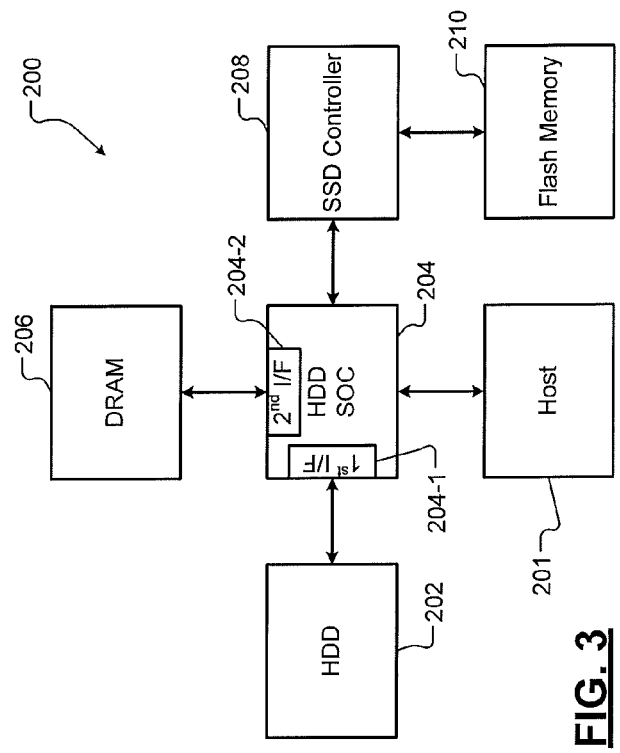
FIG. 3 is a functional block diagram of a hybrid system, where a SSD controller does not include DRAM, and the SSD controller accesses DRAM arranged external to a HDD SOC via the HDD SOC.

Referring now to FIG. 3, a hybrid system 200 includes a HDD 202, a HDD SOC 204, DRAM 206, a SSD controller 208, and flash memory 210. The HDD SOC 204 controls the HDD 202 via a suitable HDD interface 204-1 (e.g., SATA interface). The HDD SOC 204 includes an interface 204-2 to interface with the DRAM 206 arranged external to the HDD SOC 204. The SSD controller 208 controls the flash memory 210 and communicates with the host 201 via the HDD SOC 204. The SSD controller 208 translates HDD commands into flash commands and vice versa. The HDD SOC 204 communicates with a host 201 and transfers data between the host 201 and at least one of the HDD 202, the DRAM 206, and the SSD controller 208.

The HDD SOC 204 and the SSD controller 208 do not include DRAM. The SSD controller 208 borrows the DRAM 206 via the HDD SOC 204 as needed. The SSD controller 208 coordinates the use of the DRAM 206 with the HDD SOC 204 in a manner similar to that described above with reference to FIG. 2.

In the hybrid systems 150 and 200, the element that borrows the DRAM (e.g., the HDD SOC 160 in the hybrid system 150 and the SSD controller 208 in the hybrid system 200) has increased latency. Additionally, the element that interfaces directly to the DRAM (e.g., the SSD controller 154 in the hybrid system 150 and the HDD SOC 204 in the hybrid system 200) has increased pin count. The latency and pin count can be improved as follows.

Referring now to FIGS. 4A and 4B, a hybrid system 250 is shown. In FIG. 4A, the hybrid system 250 includes a packaging substrate 252 and flash memory 254. The packaging substrate 252 includes a SOC 256 and DRAM 258. The SOC 256 includes a HDC 260, a SSD controller 262, and a DRAM controller 264. The HDC 260 controls a HDD 266. The SSD controller 262 controls the flash memory 254. The SOC 256 communicates with a host 251. The HDC 260 and the SSD controller 262 communicate with the DRAM 258 via the DRAM controller 264.

The hybrid system 250 provides several benefits. For example, sharing the DRAM 258 between the HDC 260 and the SSD controller 262 results in cost savings. Additionally, if the flash memory 254 is damaged, the SSD controller 262 can be easily disabled, which results in slower performance.

Further, since the DRAM controller 264 is on the packaging substrate 252, the communication between the SOC 256 and the DRAM 258 is internal to the packaging substrate 252. The SSD controller 262 communicates with the flash memory 254, which is external to the packaging substrate 252. Accordingly, the only external connections from the SOC 256 (and the packaging substrate 252) are to the flash memory 254.

In FIG. 4B, an example of an arrangement of the packaging substrate 252, the SOC 256, and the DRAM 258 is shown. The SOC 256 and the DRAM 258 include bond pads 272, and the packaging substrate 252 includes bond pads 274. A plurality of bond pads 272 of the SOC 256 and the DRAM 258 are connected to a plurality of the bond pads 274 of the packaging substrate 252 using solder balls 270. A plurality of substrate interconnects 278 interconnects a plurality of bond pads 274 of the packaging substrate 252 to provide connections between a plurality of bond pads 272 of the SOC 256 and a plurality of bond pads 272 of the DRAM 258. The packaging substrate 252, the SOC 256, and the DRAM 258 can be arranged in other ways shown and described in U.S. patent application Ser. No. 12/565,430, filed on Sep. 23, 2009, which is incorporated herein by reference in its entirety.

The packaging substrate 252, the SOC 256, and the DRAM 258 can be encapsulated in an integrated circuit (IC) package. The IC package can be mounted on a printed circuit board (PCB). A lead frame or a ball grid array (BGA) can be used to provide connections between the packaging substrate 252 of the IC package and the PCB. Another IC (e.g., an IC comprising the flash memory 254) can be mounted on the PCB and connected to the IC package via the PCB.

The IC package can also be directly attached to another IC (e.g., an IC comprising the flash memory 254). For example, a plurality of bond pads can be provided on the packaging substrate 252, and a plurality of bond pads can be provided on the IC comprising the flash memory 254. The plurality of bond pads of the packaging substrate 252 can be connected to the plurality of the bond pads of the IC comprising the flash memory 254 using solder balls. Alternatively, the IC comprising the flash memory 254 can be integrated in the IC package as a multi-chip module (MCM) as shown and described in U.S. patent application Ser. No. 12/565,430, filed on Sep. 23, 2009, which is incorporated herein by reference in its entirety.

Figure 4C:
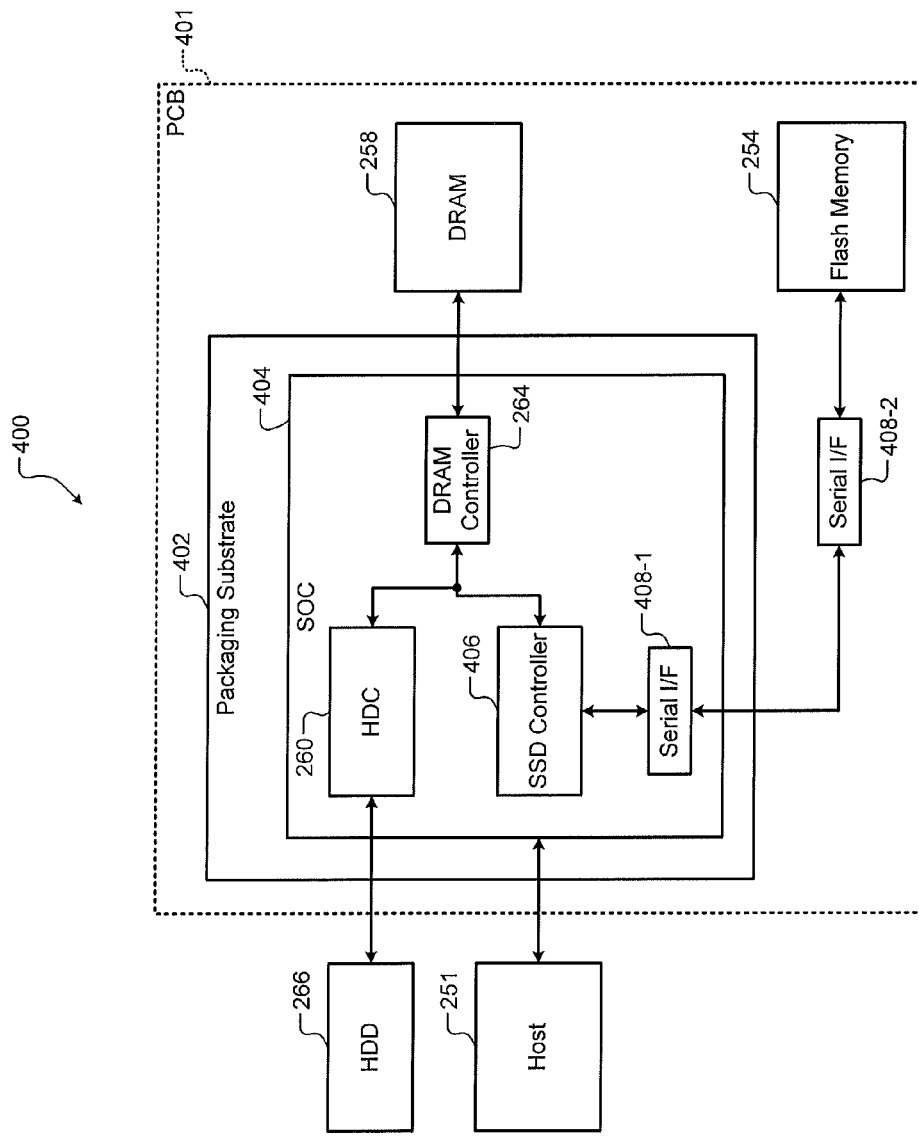
FIG. 4C is a functional block diagram of a hybrid system, where a SOC is arranged on a silicon substrate and includes a HDC, a SSD controller, and a serial interface; the HDC and the SSD controller share the DRAM; and the SSD controller communicates with flash memory via the serial interface.

Referring now to FIG. 4C, a hybrid system 400 is shown. The hybrid system 400 includes a packaging substrate 402 and flash memory 254. The packaging substrate 402 includes a SOC 404. The SOC 404 communicates with the host 251. The SOC 404 includes the HDC 260, a SSD controller 406, a serial interface 408-1, and the DRAM controller 264. The DRAM controller 264 communicates with DRAM 258. The DRAM 258 is external to the packaging substrate 402. The HDC 260 and the SSD controller 406 communicate with the DRAM 258 via the DRAM controller 264. The HDC 260 controls the HDD 266. The SSD controller 406 communicates with the flash memory 254 via the serial interface 408-1 and a serial interface 408-2 associated with the flash memory 254. The packaging substrate 402, an integrated circuit including the flash memory 254, the serial interface 408-2, and the DRAM 258 are arranged on a printed circuit board 401.

The DRAM controller 264 provides fast performance for random accesses to the DRAM 258 except for read/write operations involving small bursts. When data are read or written in small bursts, the performance slows down because read/write operations to the DRAM 258 are typically performed in number of pages or blocks at a time regardless of the amount of data read or written in the small bursts.

Using the serial interfaces 408-1 and 408-2 to communicate with the flash memory 254 reduces the number of pins for the SOC 404 and in turn for the packaging substrate 402. The serial interfaces, however, provide slow performance for random access to the flash memory 254 for small bursts. Flash memories, however, typically have large access times and are generally slow. Accordingly, the slow performance of the serial interfaces does not degrade performance of read/write operations to the flash memory 254.

Figure 4D:
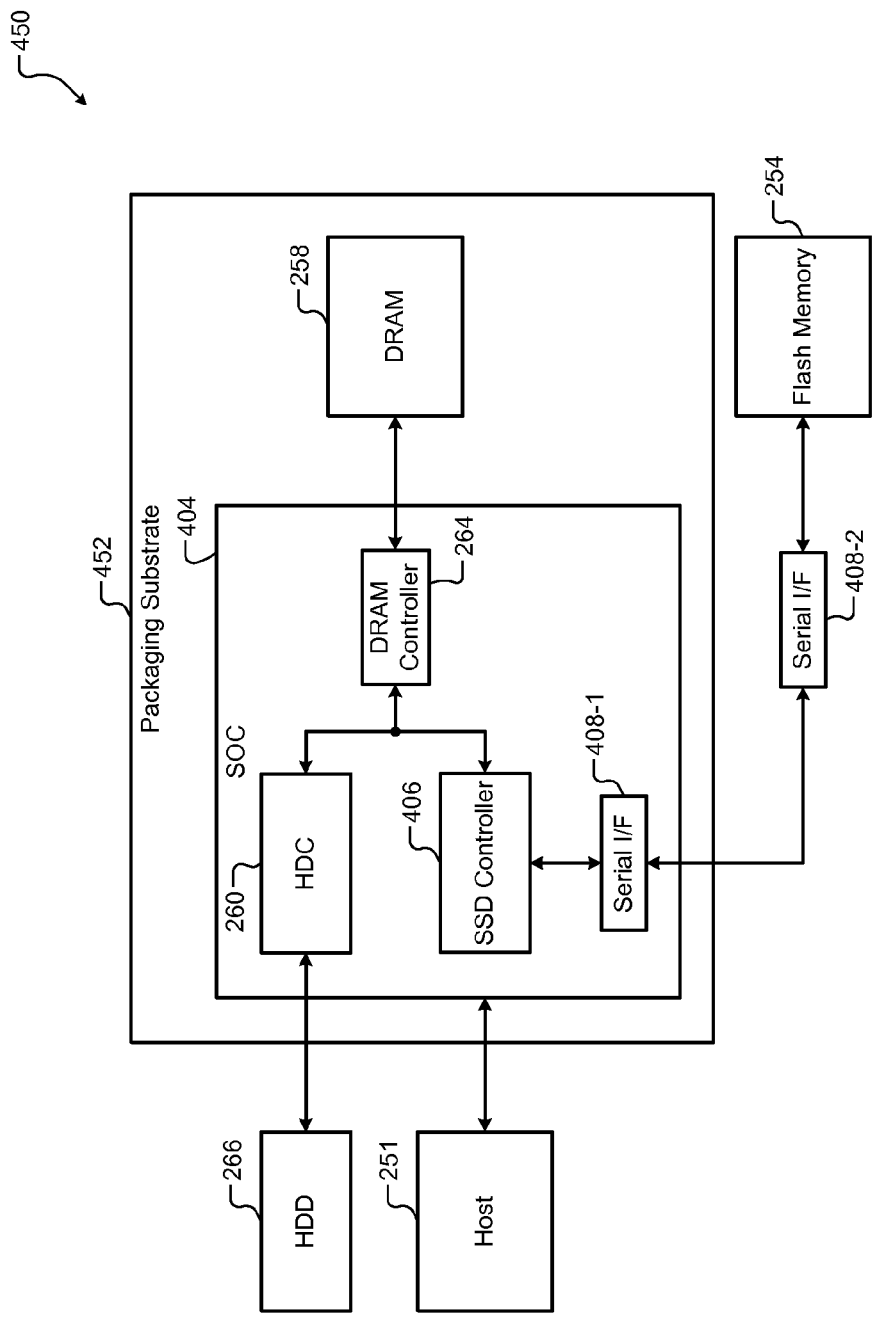
FIG. 4D is a functional block diagram of a hybrid system, where a SOC includes a HDC, a SSD controller, and a serial interface; the SOC and DRAM are arranged on a silicon substrate; the HDC and the SSD controller share the DRAM; and the SSD controller communicates with flash memory via the serial interface.

Referring now to FIG. 4D, a hybrid system 450 is shown. The hybrid system 450 includes a packaging substrate 452 that includes the SOC 404 and the DRAM 258. Since the DRAM controller 264 is on the packaging substrate 452, the communication between the SOC 404 and the DRAM 258 is internal to the packaging substrate 452. The SSD controller 406 communicates with the flash memory 254, which is external to the packaging substrate 252, via the serial interface 408-1. Accordingly, the only external connections from the SOC 404 (and the packaging substrate 452) are the connections of the serial interface 408-1 to the second serial interface 408-2 that communicates with the flash memory 254.

The packaging substrate 452, the SOC 404, and the DRAM 258 of the hybrid system 450 can be integrated as shown in FIG. 4B. While the first serial interface 408-1 is integrated in the SOC 404, the second serial interface 408-2 can be arranged on a printed circuit board (PCB) on which the flash memory 254 and the packaging substrate comprising SOC 404 (i.e., the packaging substrate 402 or 452) are arranged.

Figure 5A:
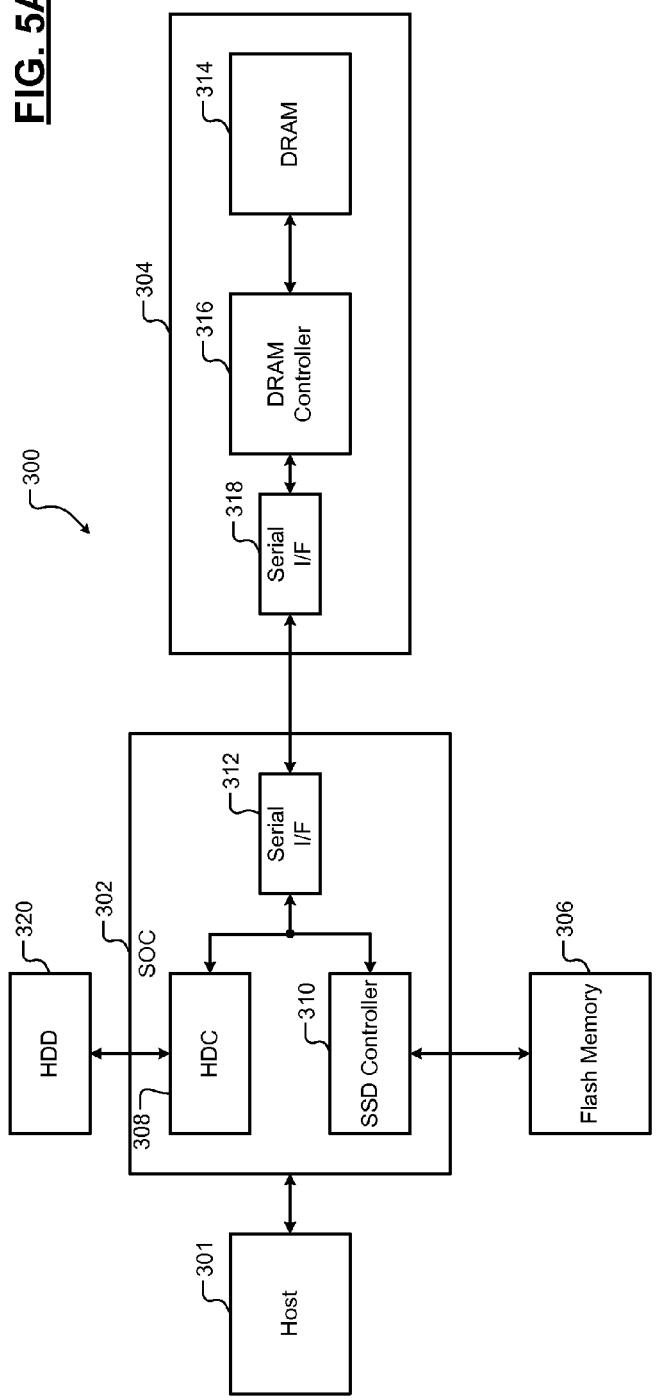
FIG. 5A is a functional block diagram of a hybrid system, where a SOC includes a HDC and a SSD controller, and the HDC and the SSD controller share DRAM arranged external to the SOC via a serial interface.
Figure 5C:
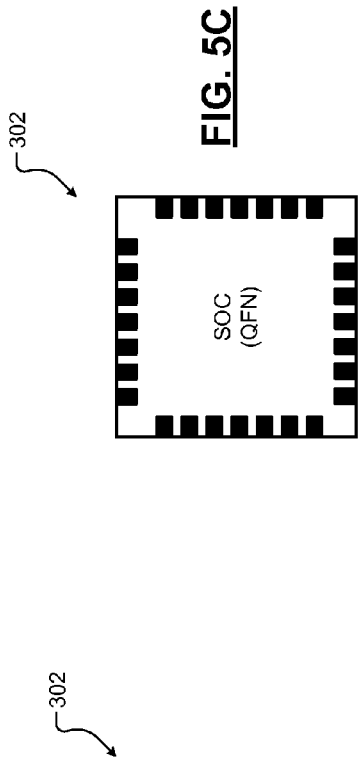
FIG. 5C depicts the SOC of FIG. 5A implemented using a quad flat no-leads (QFN) package.
Figure 5B:
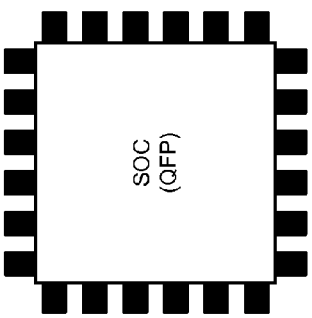
FIG. 5B depicts the SOC of FIG. 5A implemented using a quad flat package (QFP)

Referring now to FIGS. 5A-5C, a hybrid system 300 is shown. The hybrid system 300 includes a SOC 302, a DRAM integrated circuit (IC) 304, and flash memory 306. The SOC 302 includes a HDC 308, a SSD controller 310, and a serial interface 312. The HDC 308 controls a HDD 320. The SSD controller 310 controls the flash memory 306. The SOC 302 communicates with a host 301. The DRAM IC 304 includes DRAM 314, a DRAM controller 316, and a serial interface 318. The DRAM controller 316 controls the DRAM 314 and communicates with the SOC 302 via the serial interface 318. The HDC 308 and the SSD controller 310 share the serial interface 312 to access the DRAM 314.

The serial interfaces 312 and 318 include a low-pin-count serial interface. For example, the serial interfaces 312 and 318 may include an inter-IC (I2C) bus-based interface, a universal serial bus (USB) based interface, and so on. In FIG. 5B, the SOC 302 may be implemented using a quad flat package (QFP). In FIG. 5C, the SOC 302 may be implemented using a quad flat no-leads (QFN) package.

Figure 6:
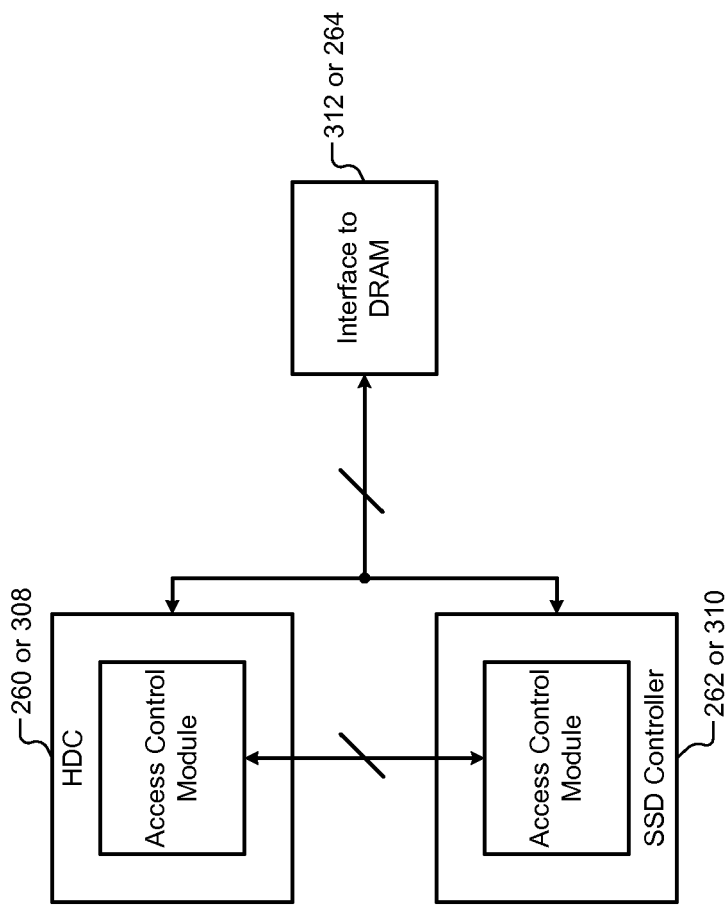
FIG. 6 depicts an example of the HDC and the SSD controller shown in FIGS. 4A and 5A.

Referring now to FIG. 6, the HDC 260, 308 and the SSD controller 262, 310 shown in FIGS. 4A and 5A may respectively include an access control module 500-1 and 500-2 (collectively access control modules 500). The access control modules 500 coordinate access of the HDC and the SSD controller to DRAM (258 or 314) via an interface (258 or 312) to the DRAM.

For example, the access control module 500-1 of the HDC may send (e.g., assert) a first control signal to the access control module 500-2 of the SSD controller when the HDC accesses the DRAM. The access control module 500-1 may drop (e.g., de-assert) the first control signal when the HDC completes the data transfer with the DRAM. Based on the first control signal, the access control module 500-2 may prevent the SSD controller from accessing the DRAM while the HDC accesses the DRAM.

The access control module 500-2 may send a request to the access control module 500-1 when the SSD controller needs to access the DRAM while the first control signal is asserted (i.e., while the HDC is accessing the DRAM). The access control module 500-1 may determine if the current data transfer between the HDC and the DRAM can be temporarily suspended and access to the DRAM can be given to the SSD controller as requested. The access control module 500-1 may respond by sending a second control signal to the access control module 500-2.

The second control signal may indicate whether the access to the DRAM is granted to the SSD controller as requested. If access is granted, the second control signal may indicate whether access is granted for the entire data transfer or only for a portion of the data transfer requested by the SSD controller. A similar handshake (i.e., exchange of signals) can be performed when the HDC needs to access the DRAM while the SSD controller is accessing the DRAM.

Access to DRAM may also be controlled using priority-based arbitration. For example, access to DRAM may be granted to the HDC or the SSD controller based on priority of the type of data transfer being performed by the HDC and the SSD controller. For example, the HDC may be granted access to the DRAM over the SSD controller if buffering data being read from the HDD is of higher priority than buffering data being moved from the SSD to the HDD. Other ways of controlling access to the DRAM are contemplated.

Throughout the disclosure, flash memory is used only as an example of nonvolatile semiconductor memory. Other types of nonvolatile semiconductor memory such as phase change memory may be used instead. Further, DRAM is used only as an example of RAM. Other types of RAM such as static RAM (SRAM) may be used instead.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

What is claimed is:

1. A system comprising:
a solid-state disk controller configured to (i) control flash memory and (ii) communicate with a host, wherein the solid-state disk controller includes (i) a first interface to interface a hard disk drive to the host and (ii) a second interface to interface with a dynamic random access memory arranged external to the solid-state disk controller; and
a hard disk controller system-on-chip configured to (i) control the hard disk drive, (ii) communicate with the host via the first interface of the solid-state disk controller, and (iii) access the dynamic random access memory via the second interface of the solid-state disk controller,
wherein the first interface of the solid-state disk controller interfaces the hard disk drive to the host via the hard disk controller system-on-chip.

2. The system of claim 1, wherein the solid-state disk controller is configured to transfer data between the host and at least one of the flash memory, the dynamic random access memory, and the hard disk drive.

3. The system of claim 1, further comprising at least one of the flash memory, the dynamic random access memory, and the hard disk drive.

4. A system comprising:
a hard disk controller system-on-chip configured to (i) control a hard disk drive and (ii) communicate with a host, wherein the hard disk controller system-on-chip includes (i) a first interface to interface with the hard disk drive and (ii) a second interface to interface with a dynamic random access memory arranged external to the hard disk controller system-on-chip; and
a solid-state disk controller configured to (i) control flash memory, (ii) communicate with the host via the hard disk controller system-on-chip, and (iii) access the dynamic random access memory via the second interface of the hard disk controller system-on-chip.

5. The system of claim 4, wherein the hard disk controller system-on-chip is configured to transfer data between the host and at least one of the hard disk drive, the dynamic random access memory, and the solid-state disk controller.

6. The system of claim 4, further comprising at least one of the flash memory, the dynamic random access memory, and the hard disk drive.

7. A system comprising:
a packaging substrate;
a first integrated circuit arranged on the packaging substrate, wherein the first integrated circuit includes a dynamic random access memory; and
a second integrated circuit arranged on the packaging substrate, wherein the
second integrated circuit includes a system-on-chip, and wherein the system-on-chip includes
a hard disk controller configured to control a hard disk drive;
a solid-state disk controller configured to control flash memory arranged external to the packaging substrate; and
a dynamic random access memory controller configured to communicate with the dynamic random access memory,
wherein the hard disk controller and the solid-state disk controller access the dynamic random access memory via the dynamic random access memory controller, and
wherein the dynamic random access memory controller of the second integrated circuit is connected to the dynamic random access memory of the first integrated circuit via the packaging substrate.

8. The system of claim 7, further comprising:
a third integrated circuit including the flash memory,
wherein the packaging substrate and the third integrated circuit are mounted on a printed circuit board.

9. The system of claim 8, further comprising:
a first serial interface configured to communicate with the solid-state disk controller, wherein the first serial interface is included in the second integrated circuit; and
a second serial interface configured to communicate with the third integrated circuit including the flash memory, wherein the second serial interface is arranged on the printed circuit board.

10. A system comprising:
a first integrated circuit arranged on a packaging substrate, wherein the first integrated circuit includes a system-on-chip, and wherein the system-on-chip includes
a hard disk controller configured to control a hard disk drive;
a solid-state disk controller configured to control flash memory arranged external to the packaging substrate;
a dynamic random access memory controller configured to communicate with a dynamic random access memory arranged external to the packaging substrate, wherein the hard disk controller and the solid-state disk controller access the dynamic random access memory via the dynamic random access memory controller; and
a first serial interface, wherein the solid-state disk controller is configured to control the flash memory via the first serial interface.

11. The system of claim 10, further comprising:
a second integrated circuit including the flash memory; and
a second serial interface configured to communicate with the second integrated circuit and the first serial interface,
wherein the packaging substrate, the second integrated circuit, and the second serial interface are mounted on a printed circuit board.

12. The system of claim 11, further comprising the dynamic random access memory arranged on the printed circuit board.

13. A system comprising:
an integrated circuit including
a dynamic random access memory,
a dynamic random access memory controller configured to control the dynamic random access memory, and
a first serial interface; and
a system-on-chip including
a hard disk controller configured to control a hard disk drive;
a solid-state disk controller configured to control flash memory arranged external to the system-on-chip; and
a second serial interface,
wherein the hard disk controller and the solid-state disk controller access the dynamic random access memory via the second serial interface.

14. The system of claim 13, wherein the system-on-chip is packaged as a quad flat package or a quad flat no-leads package.

* * * * *